(12) United States Patent
Caffee et al.

(10) Patent No.: US 7,999,523 B1
(45) Date of Patent: Aug. 16, 2011

(54) DRIVER WITH IMPROVED POWER SUPPLY REJECTION

(75) Inventors: Aaron J. Caffee, Saint Helens, OR (US); Jeffrey L. Sonntag, Portland, OR (US)

(73) Assignee: Silicon Laboratories Inc., Austin, TX (US)

( * ) Notice: Subject to any disclaimer, the term of this patent is extended or adjusted under 35 U.S.C. 154(b) by 101 days.

(21) Appl. No.: 12/201,070

(22) Filed: Aug. 29, 2008

(51) Int. Cl.
*G05F 1/10* (2006.01)
*G05F 1/44* (2006.01)

(52) U.S. Cl. ......... 323/271; 323/225; 327/134; 327/540

(58) Field of Classification Search .................. 323/223, 323/224, 282, 284, 225, 268, 271; 327/134, 327/156, 540
See application file for complete search history.

(56) References Cited

U.S. PATENT DOCUMENTS

| | | | |
|---|---|---|---|
| 5,121,080 A | 6/1992 | Scott, III et al. | |
| 5,374,861 A | 12/1994 | Kubista | |
| 5,402,485 A | 3/1995 | Takato et al. | |
| 5,440,244 A | 8/1995 | Richter et al. | |
| 5,486,778 A | 1/1996 | Lou | |
| 5,550,496 A | 8/1996 | Desroches | |
| 5,570,037 A | 10/1996 | Llorens | |
| 5,870,296 A * | 2/1999 | Schaffer | 363/65 |
| 5,939,904 A | 8/1999 | Fetterman et al. | |
| 6,028,479 A | 2/2000 | Babanezhad | |
| 6,054,881 A | 4/2000 | Stoenner | |
| 6,147,520 A | 11/2000 | Kothandaraman et al. | |
| 6,280,011 B1 | 8/2001 | Schloeman et al. | |
| 6,281,702 B1 | 8/2001 | Hui | |
| 6,300,802 B1 | 10/2001 | Smetana | |
| 6,373,297 B1 | 4/2002 | Lee et al. | |
| 6,433,579 B1 | 8/2002 | Wang et al. | |
| 6,437,599 B1 | 8/2002 | Groen | |
| 6,445,223 B1 | 9/2002 | Thilenius | |
| 6,504,397 B1 | 1/2003 | Hart et al. | |
| 6,529,070 B1 | 3/2003 | Nagaraj | |
| 6,580,292 B2 | 6/2003 | West et al. | |
| 6,603,329 B1 | 8/2003 | Wang et al. | |
| 6,664,814 B1 | 12/2003 | Evans et al. | |
| 6,670,830 B2 | 12/2003 | Otsuka et al. | |
| 6,700,403 B1 | 3/2004 | Dillon | |

(Continued)

OTHER PUBLICATIONS

Boni, Andrea, et al., "LVDS I/O Interface for Gb/s-per-Pin Operation in 0.35-µm CMOS," *IEEE Journal of Solid-State Circuits*, vol. 36, No. 4, Apr. 2001, pp. 706-711.

(Continued)

*Primary Examiner* — Gary L Laxton
*Assistant Examiner* — Nusrat J Quddus
(74) *Attorney, Agent, or Firm* — Zagorin O'Brien Graham LLP

(57) ABSTRACT

A technique reduces effects of power supply noise on a signal output by an integrated circuit output driver circuit powered at least partially by an external power supply. An integrated circuit includes a first circuit that provides a first version of a signal to be output referenced between a first regulated voltage and a first power supply voltage of an external power supply. A second circuit provides a second version of the signal to be output referenced between a second regulated voltage and a second power supply voltage of the external power supply. A third circuit provides a third version of the signal to be output referenced between the first power supply voltage and the second power supply voltage and based on the first and second versions of the signal to be output and power received from the external power supply.

23 Claims, 7 Drawing Sheets

U.S. PATENT DOCUMENTS

| | | | |
|---|---|---|---|
| 6,744,275 | B2 | 6/2004 | Chansungsan |
| 6,744,280 | B2 | 6/2004 | Morgan et al. |
| 6,760,381 | B2 | 7/2004 | Lu |
| 6,771,136 | B1 | 8/2004 | Reynolds |
| 6,812,734 | B1 | 11/2004 | Shumarayev et al. |
| 6,815,980 | B2 | 11/2004 | Kerr |
| 6,856,178 | B1 | 2/2005 | Narayan |
| 6,940,302 | B1 | 9/2005 | Shumarayev et al. |
| 6,963,219 | B1 | 11/2005 | Ghia et al. |
| 7,012,450 | B1 | 3/2006 | Oner et al. |
| 7,034,574 | B1 | 4/2006 | Li |
| 7,088,181 | B1 | 8/2006 | Voo |
| 7,145,359 | B2 | 12/2006 | Hein et al. |
| 7,177,616 | B2 | 2/2007 | Connell et al. |
| 2003/0178975 | A1* | 9/2003 | Schuellein et al. ............ 323/272 |
| 2004/0095104 | A1* | 5/2004 | Brooks ......................... 323/272 |
| 2004/0174215 | A1 | 9/2004 | Li et al. |
| 2005/0184805 | A1 | 8/2005 | Murakami |
| 2005/0212553 | A1 | 9/2005 | Best et al. |
| 2005/0237082 | A1 | 10/2005 | Shumarayev et al. |
| 2005/0285629 | A1 | 12/2005 | Hein et al. |
| 2006/0022753 | A1 | 2/2006 | Bonaccio et al. |
| 2006/0082415 | A1 | 4/2006 | Gopinathan et al. |
| 2006/0091931 | A1 | 5/2006 | Leete |
| 2007/0285128 | A1 | 12/2007 | Singor |
| 2008/0055760 | A1 | 3/2008 | Tiwari et al. |

OTHER PUBLICATIONS

Chen, Mingdeng, et al., "Low-Voltage Low-Power LVDS Drivers," *IEEE Journal of Solid-State Circuits*, vol. 40, No. 2, Feb. 2005, pp. 472-479.

Goldie, John, "LVDS, CML, ECL-differential interfaces with odd voltages," retrieved from URL http://www.planetanalog.corn/ Jan. 21, 2003, 9 pages.

Heydari, Payam, "Design Issues in Low-Voltage High-Speed Current-Mode Logic Buffers," *GLVSLSI '03*, Apr. 28-29, 2003, Washington, DC, USA, 6 pages.

Integrated Circuit Systems, Inc., "HiPerClockS (TM) Application Note, 3.3V LVPECL Driver Termination," Aug. 2, 2002, 7 pages, retrieved from URL ww.iest.com/products/hiperclocks.html.

Ju, Jeff, "Interfacing LVDS with other differential-I/O types," retrieved from URL www.eda.com, Oct. 30, 2003, pp. 81-82, 84 and 86.

Kumric, Marijan, et al., "Digitally tuneable on-chip line termination resistor for 2.6Gbit/s LVDS receiver in 0.25μ standard CMOS technology," in *Proceedings of the 27th European Solid-State Circuits Conference(ESSCIRC 2001)*, Sep. 18-20, 2001, pp. 241-244.

Ma, Jimmy, "Termination Schemes and Design Guidelines for 3.3V LVPECL Driver," Application Note #73, Pericom Semiconductor Corporation, San Jose, CA, 2 pages, retrieved May 19, 2004 from URL www.pericom.com.

Maxim High-Frequency/Fiber Communications Group, "Introduction to LVDS, PECL, and CML," Application Note: HFAN-1.0, Rev. 0, Sep. 2000, pp. i-14.

Micrel Semiconductor, "High-Speed PECL and LVPECL Termination," 2 pages, retrieved from URL www.micrel.com/solutions.shtml.

Silicon Laboratories Product Sheet AN59, "Optimizing Design and Layout for the Si5318/20/21/64 Clock ICs," Rev. 1.0, Jun. 2005, 19 pages.

Von Herzen, Brian and Brunetti, Jon, "Virtex-E LVPECL Receivers in Multi-Drop Applications," XILINX Application Note: Virtex-E Family, XAPP237, v1.1, Feb. 24, 2000, 8 pages, retrieved from URL www.xilinx.com.

Yang, Ken, "Modified LDO Regulator Sinks PECL-Termination Current," *Planet Analog*, Jun. 28, 2005, 4 pages, retrieved Sep. 2, 2005 from URL http://www.planotanalog.com/showArticle?articleID=164903593.

* cited by examiner

DRIVER WITH IMPROVED POWER SUPPLY REJECTION

BACKGROUND

1. Field of the Invention

This invention relates to integrated circuits and more particularly to integrated circuits receiving power from a power supply susceptible to noise.

2. Description of the Related Art

In general, integrated circuits receive power from an energy source external to the integrated circuit. The integrated circuit may include a power supply regulation circuit that generates an on-chip, regulated, DC power supply from power received from the external energy source. Typically, the on-chip regulated power supply limits changes in an output voltage or current in response to changes to an external power supply voltage, output load, ambient temperature, time, or other factors. In addition, the on-chip regulated power supply may provide power using a different voltage level (e.g., a voltage level consistent with an on-chip power supply domain) than the voltage level of the external energy source (e.g., a voltage level consistent with an external power supply domain).

A typical output stage of the integrated circuit receives a signal (e.g., a signal consistent with an on-chip power supply domain) from other circuits internal to the integrated circuit and delivers the signal to a terminal (e.g., port, pad, or other suitable output structure) of the integrated circuit. When the output stage is at least partially powered by the external energy source or power supply, the signal delivered to the terminal is susceptible to noise from the external power supply. For example, the signal delivered to the terminal may vary in amplitude or in delay in response to changes to the external power supply voltage.

SUMMARY

A technique reduces effects of power supply noise on a signal output by an integrated circuit output driver circuit at least partially powered by an external power supply. In at least one embodiment of the invention, an integrated circuit includes a first regulator circuit configured to receive power from an external power supply and configured to provide a first regulated voltage. The integrated circuit includes a second regulator circuit configured to receive power from the external power supply and configured to provide a second regulated voltage. The integrated circuit includes a first circuit configured to provide a first version of a signal to be output referenced between the first regulated voltage and a first power supply voltage on a first power supply node coupled to the external power supply. The integrated circuit includes a second circuit configured to provide a second version of the signal to be output referenced between the second regulated voltage and a second power supply voltage on a second power supply node coupled to the external power supply. The integrated circuit includes a third circuit configured to provide a third version of the signal to be output at least partially based on the first and second versions of the signal to be output and power received from the external power supply. The third version of the signal to be output is referenced between the first power supply voltage and the second power supply voltage.

In at least one embodiment of the invention, a method includes generating a first regulated voltage at least partially based on power received from an external power supply. The method includes generating a second regulated voltage at least partially based on power received from the external power supply. The method includes generating a first version of a signal to be output referenced between the first regulated voltage and a first power supply voltage on a first power supply node coupled to the external power supply. The method includes generating a second version of the signal to be output referenced between the second regulated voltage and a second power supply voltage on a second power supply node coupled to the external power supply. The method includes providing to an output node, a third version of the signal to be output at least partially based on the first and second versions of the signal to be output and power received from the external power supply. The third version of the signal to be output is referenced between the first power supply voltage and the second power supply voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1A:
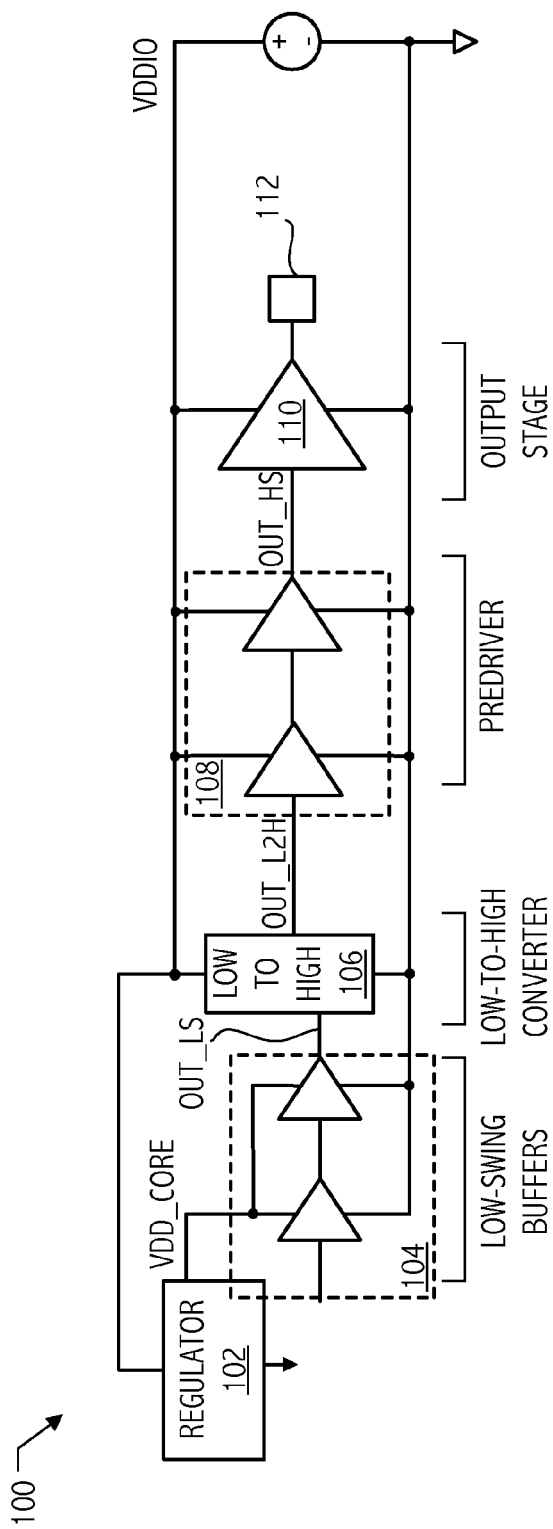
FIG. 1A illustrates a block diagram of an exemplary output driver circuit.
Figure 1B:
FIG. 1B illustrates exemplary signal waveforms consistent with the output driver circuit of FIG. 1A.
Figure 1C:
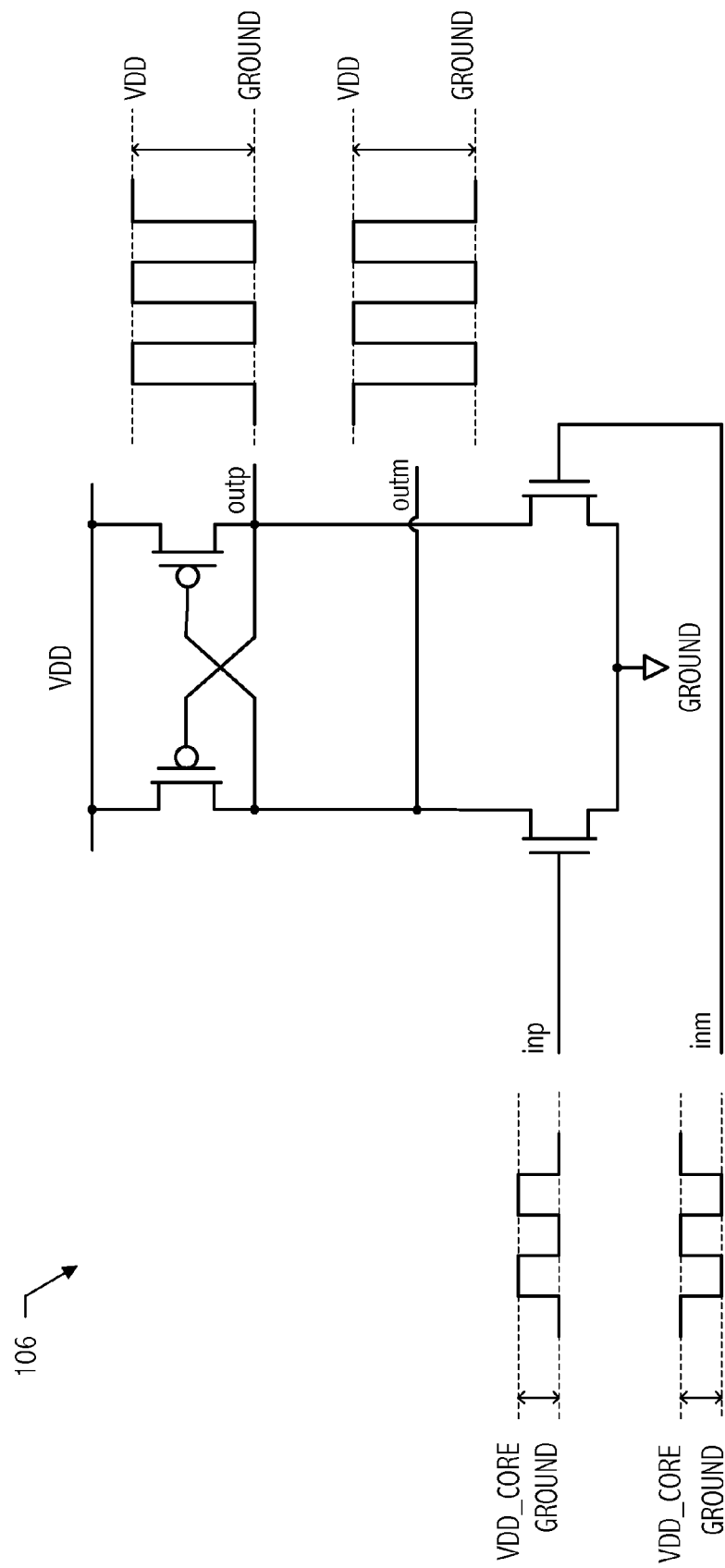
FIG. 1C illustrates an exemplary low-to-high converter circuit consistent with the output driver circuit of FIG. 1A.

Referring to FIGS. 1A and 1B, a typical output driver circuit (e.g., output driver circuit 100) of an integrated circuit includes low-voltage-swing buffers (e.g., buffers 104), which receive a regulated voltage (e.g., VDD_CORE received from voltage regulator 102). The low-voltage-swing buffers receive and generate signals within a first voltage domain (e.g., a core voltage domain). For example, low-swing buffers 104 receive and generate low-voltage, low-voltage-swing signals (e.g., OUT_LS) referenced between a first regulated voltage and a first power supply voltage on a first power supply node coupled to the external power supply, i.e., GND<=OUT_LS<=VDD_CORE, e.g., 0V<=OUT_LS<=1V). A low-voltage, low-voltage-swing signal is converted (e.g., using low-to-high converter circuit 106) to a signal associated with a second voltage domain (e.g., an I/O voltage domain). For example, low-to-high converter circuit 106 receives the low-voltage, low-voltage-swing signal from low-swing buffers 104 and converts it to a high-voltage, high-voltage-swing signal referenced between the first power supply voltage on the first power supply node coupled to the external power supply and a second power supply voltage on a second power supply node coupled to the external power supply (i.e., GND<=OUT_L2H<=VDDIO, e.g., 0V<=OUT_L2H<=3.3V). An exemplary differential low-to-high converter circuit 106 is illustrated in FIG. 1C. However, other suitable low-to-high converter circuits 106 may be used.

Referring back to FIGS. 1A and 1B, typical low-to-high conversion circuits which transition a signal to be output from a first voltage domain to a second voltage domain, are inefficient at driving signals. Accordingly, at least one predriver circuit (e.g., predriver 108) is used to increase the drive strength of a signal (e.g., OUT_HS) provided to an output stage of the driver circuit (e.g., output stage 110). The output stage delivers the high-voltage, high-voltage-swing signal to a terminal of the integrated circuit (e.g., pad 112). Note that electrostatic discharge protection circuitry (not shown) and/or other suitable circuitry may be coupled to pad 112. Since the low-to-high converter circuit and the predriver circuit are powered from an external power supply without on-chip voltage regulation, noise on the external power supply may modulate a delay through the corresponding signal path (e.g., the signal path including low-to-high converter circuit 106, predriver 108, and output stage 110), thus causing jitter on the output signal. In addition, the signal path including low-to-high converter circuit 106, predriver 108, and output stage 110 typically includes high-voltage devices. As referred to herein, high-voltage devices (e.g., I/O devices) are devices that can withstand higher voltages than other, lower-voltage or low-voltage devices of the integrated circuit (e.g., core devices). High-voltage devices typically have a greater channel length and typically introduce greater delay in the signal path as compared to the lower-voltage or low-voltage devices.

Figure 2A:
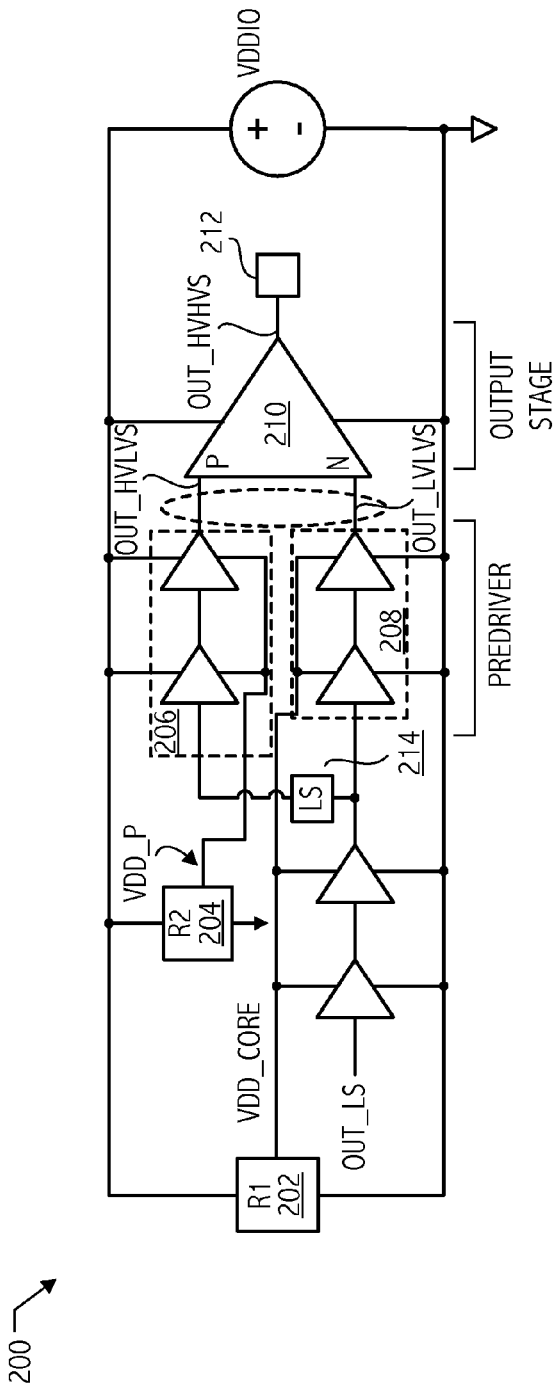
FIG. 2A illustrates a block diagram of an exemplary output driver circuit consistent with at least one embodiment of the invention.
Figure 2B:
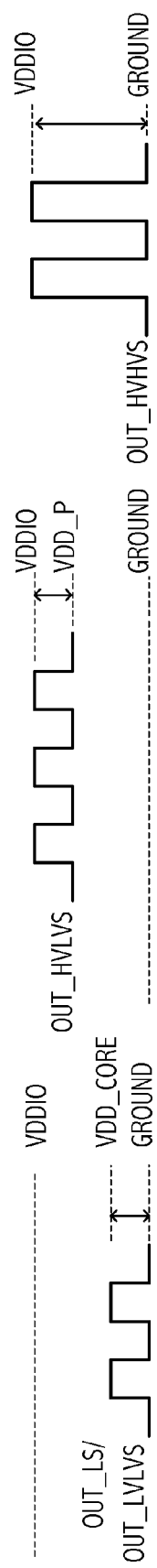
FIG. 2B illustrates exemplary signal waveforms consistent with the output driver circuit of FIG. 2A.

Referring to FIGS. 2A and 2B, an exemplary output driver circuit 200 receives a signal (e.g., OUT_LS) and provides a version of that signal to be output from a terminal (e.g., pad 212) of an integrated circuit. In at least one embodiment of output driver circuit 200, the signal received by output driver circuit 200 is a low-voltage, low-voltage-swing signal (e.g., OUT_LS) referenced between a first regulated voltage (e.g., VDD_CORE, generated by voltage regulator circuit 202) and a first power supply voltage (e.g., GND) on a first power supply node coupled to the external power supply (i.e., GND<=OUT_LS<=VDD_CORE, e.g., 0V<=OUT_LS<=1V). The predriving functions of output driver circuit 200 are performed by a high-side predriver circuit (e.g., high-side predriver 206) and a low-side predriver circuit (e.g., low-side predriver 208). Predriver circuits 206 and 208 are fully regulated, i.e., high-side predriver circuit 206 and low-side predriver circuit 208 limit changes in a corresponding voltage difference or current in response to changes in the external power supply. For example, voltage regulator circuit 202 is any suitable voltage reference circuit that generates an output voltage (e.g., VDD_CORE) that results in a voltage difference (e.g., VDD_CORE-GROUND) that is substantially stable irrespective of changes to the voltage difference (e.g., VDDIO-GROUND) provided by the external power supply. Voltage regulator circuit 204 is any suitable voltage reference circuit that generates an output voltage (e.g., VDD_P) that results in a voltage difference (e.g., VDDIO-VDD_P) that is substantially stable irrespective of changes to the voltage difference provided by the external power supply. For example, if VDD_P generates a 2.3V voltage when the external power supply provides a 3.3V voltage difference, the voltage difference between VDDIO and VDD_P is 1V. If the voltage difference provided by the external power supply changes to 3.6V, voltage regulator circuit 204 changes VDD_P to a voltage of 2.6V that tracks the change in the external power supply, thereby maintaining the 1V voltage difference between VDDIO and VDD_P.

In at least one embodiment, low-side predriver circuit 208 does not perform any signal level shifting, i.e., the low-side predriver circuit receives and generates a low-voltage, low-voltage-swing version of the signal to be output, which may be a ground-referenced signal that varies between ground and the first regulated voltage level provided by voltage regulator circuit 202 (i.e., GND<=OUT_LVLVS<=VDD_CORE, e.g., 0V<=OUT_LVLVS<=1.0V). In at least one embodiment, high-side predriver circuit 206 receives a level-shifted version of the signal to be output, i.e., a high-voltage, low-voltage-swing version of the signal to be output. In at least one embodiment of output driver circuit 200, the high-voltage, low-voltage-swing version of the signal to be output is referenced between a second regulated voltage level (e.g., VDD_P provided by voltage regulator circuit 204) and the external supply voltage, VDDIO (i.e., VDD_P<=OUT_HVLVS<=VDDIO, e.g., 2.3V<=OUT_HVLVS<=3.3V). High-side predriver circuit 206 and low-side predriver circuit 208 deliver a high-voltage, low-voltage-swing version of the signal to be output (e.g., OUT_HVLVS) and a low-voltage, low-voltage-swing version of the signal to be output (e.g., OUT_LVLVS), respectively, to output stage 210. A combination of a low-side predriver circuit and a high-side predriver circuit with any suitable output stage 210 and any suitable level-shifting circuit 214 reduces the effect of external power supply noise on a signal delivered to a terminal (e.g., pad 212), as compared to the effect of external power supply noise on output driver circuit 100. Note that electrostatic discharge protection circuitry (not shown) and/or other suitable circuitry may be coupled to pad 212.

Figure 3A:
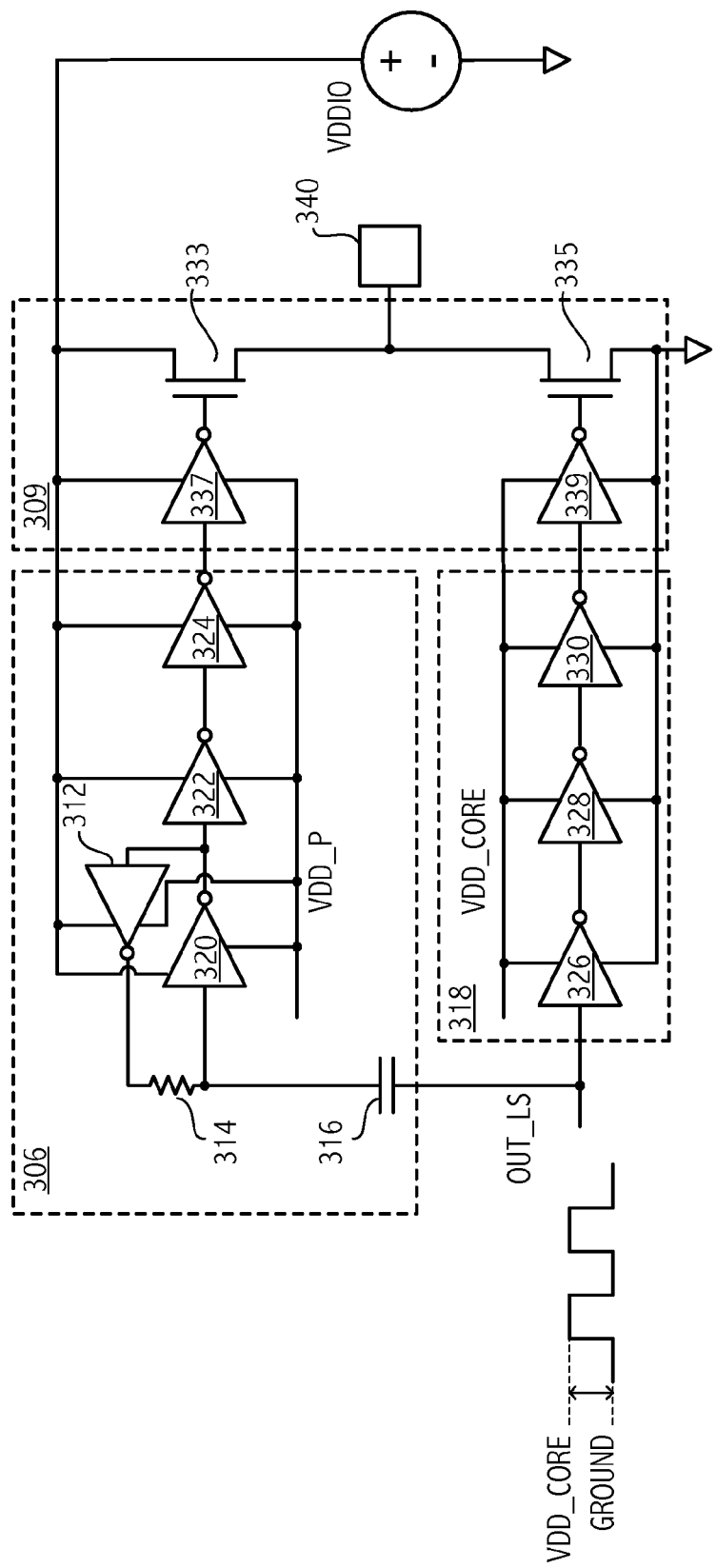
FIG. 3A illustrates an exemplary output driver circuit portion consistent with at least one embodiment of the invention.
Figure 3B:
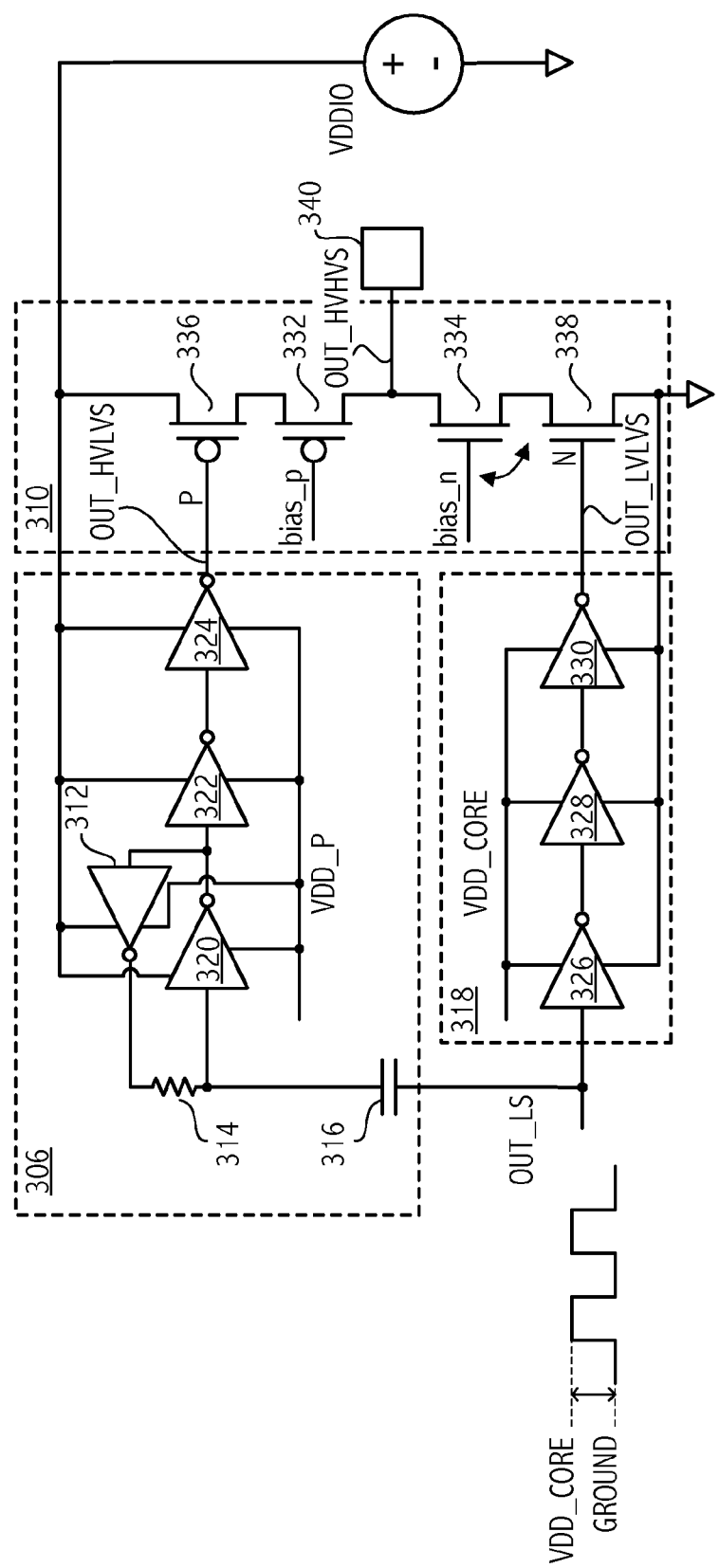
FIG. 3B illustrates an exemplary output driver circuit portion consistent with at least one embodiment of the invention.

Referring to FIGS. 3A and 3B, in at least one embodiment of an output driver circuit, the functions of level shifting circuit 214 and high-side predriver circuit 206 are combined into an exemplary circuit portion 306. Circuit portion 306 includes capacitor 316, which is configured to level-shift a version of OUT_LS to generate a high-voltage, low-voltage-swing signal. The combination of resistor 314 and inverter 312 restores a DC component of OUT_LS to the level-shifted signal. In at least one embodiment of circuit portion 306, resistor 314 is not included because the non-zero output impedance of the feedback inverter is sufficient for the feedback restore function. However, resistor 314 may be included to stabilize circuit performance over process variations when polysilicon resistors are easier to control than the inverter impedance, which may allow aggressively sizing the capacitor to reduce circuit area. The level-shifted, DC restored signal is provided to inverter 320. In at least one embodiment, circuit portion 306 is initialized to a state that reduces or avoids a crowbar current in the output stage. For example, switches may be included in circuit portion 306 to configure circuit portion 306 in an initial state when a control signal is asserted. In another embodiment of circuit portion 306, logic is included on the integrated circuit to configure circuit portion 306 to generate a particular output in response to a starting input.

Figure 4:
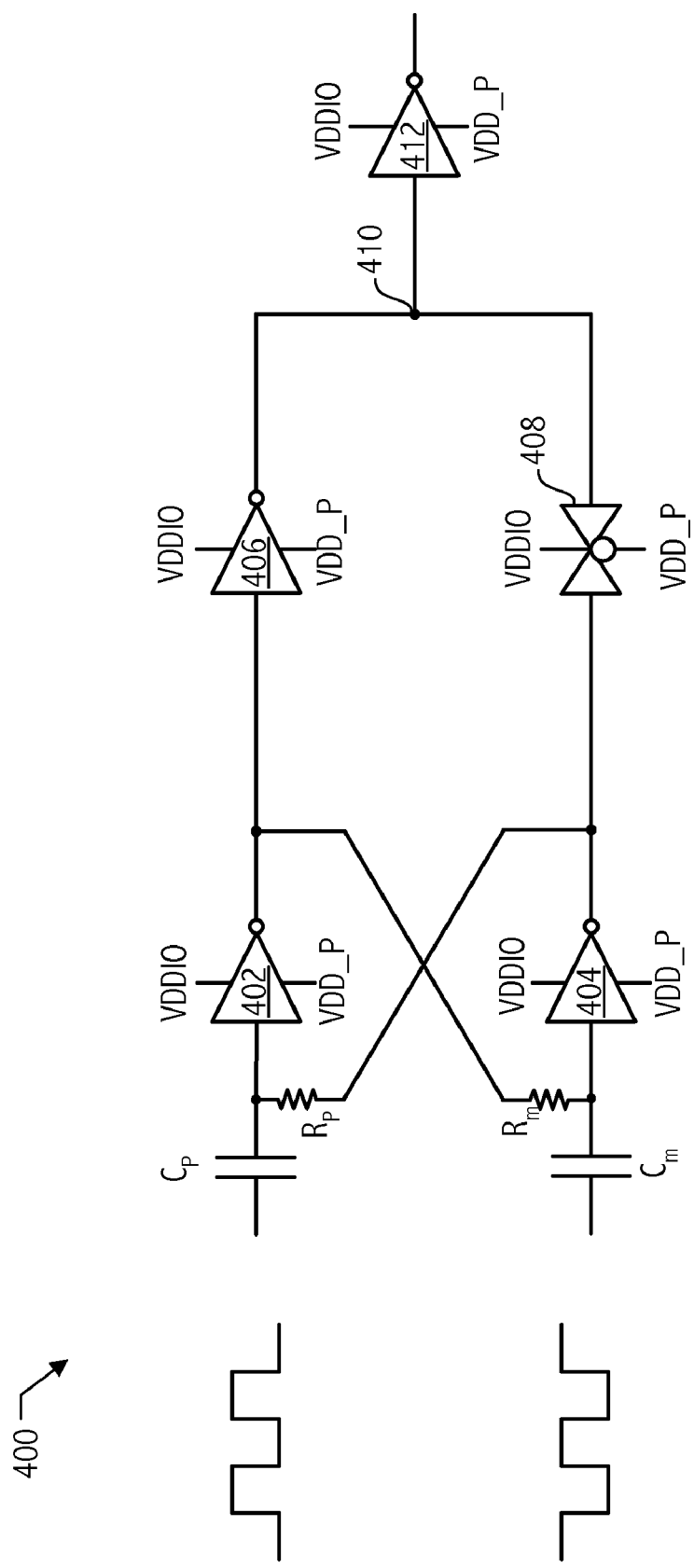
FIG. 4 illustrates an exemplary output driver circuit portion consistent with at least one embodiment of the invention.

In at least one embodiment of output driver circuit 200, an alternate embodiment of circuit portion 306 uses averaging to reduce the sensitivity of circuit portion 306 to noise on the external power supply. Referring to circuit portion 400 of FIG. 4, a differential input signal (e.g., differential version of OUT_LS) is level-shifted and DC restored using a latch circuit (e.g., the latch circuit including Rp, Rm, and inverters 402 and 404). Summing node 410 receives the level-shifted, DC restored differential signal and generates a single-ended version of the signal corresponding to an average value. External power supply noise injected into the inverted and non-inverted signal paths is substantially reduced or eliminated by the averaging function provided by circuit portion 400. Appropriate delay (e.g., delay that matches the delay of the low-side predriver), drive characteristics, and polarity of the differential signal components are provided by inverters 406 and 412 and transmission gate 408. In at least one embodiment, circuit portion 400 is initialized to a state that reduces or avoids a crowbar current in the output stage. For example, switches may be included in circuit portion 400 to configure circuit portion 400 in an initial state when a control signal is asserted. In another embodiment of circuit portion 400, logic is included in circuit portion 400 to generate a particular output when a starting input is provided. Note that other embodiments of circuit portion 306 of FIGS. 3A and 3B and circuit portion 400 of FIG. 4 include other combinations of circuit elements to provide appropriate signal characteristics. For example, in at least one embodiment of circuit portion 306, a DC-coupled level-shifting circuit that does not require DC restoration or initialization is used.

Referring back to FIGS. 3A and 3B, the high-side predriver of circuit portion 306 and low-side predriver 318 deliver a high-voltage, low-voltage-swing version of the signal to be output (e.g., OUT_HVLVS) and a low-voltage, low-voltage-swing version of the signal to be output (e.g., OUT_LVLVS), respectively, to output stage 309 of FIG. 3A or output stage 310 of FIG. 3B. Referring to FIG. 3A, in exemplary output stage 309, signals received from the high-side and low-side predriver circuits, OUT_HVLVS and OUT_LVLVS respectively, drive corresponding ones of inverters 337 and 339, which drive devices 333 and 335, respectively. Devices 333 and 335 generate a high-voltage, high-voltage-swing signal and provide it to pad 340.

Referring to FIG. 3B, in at least one embodiment of an output driver circuit, another exemplary output stage (e.g., output stage 310) includes input devices (e.g., input devices 336 and 338, respectively) responsive to OUT_HVLVS and OUT_LVLVS received from the high-side and low-side predriver circuits, respectively, which drive corresponding bias devices (e.g., bias devices 332 and 334, respectively). The gate-to-source voltages of bias devices 332 and 334 are not substantially modulated by noise on power supply signals provided by the external power supply.

Figure 5:
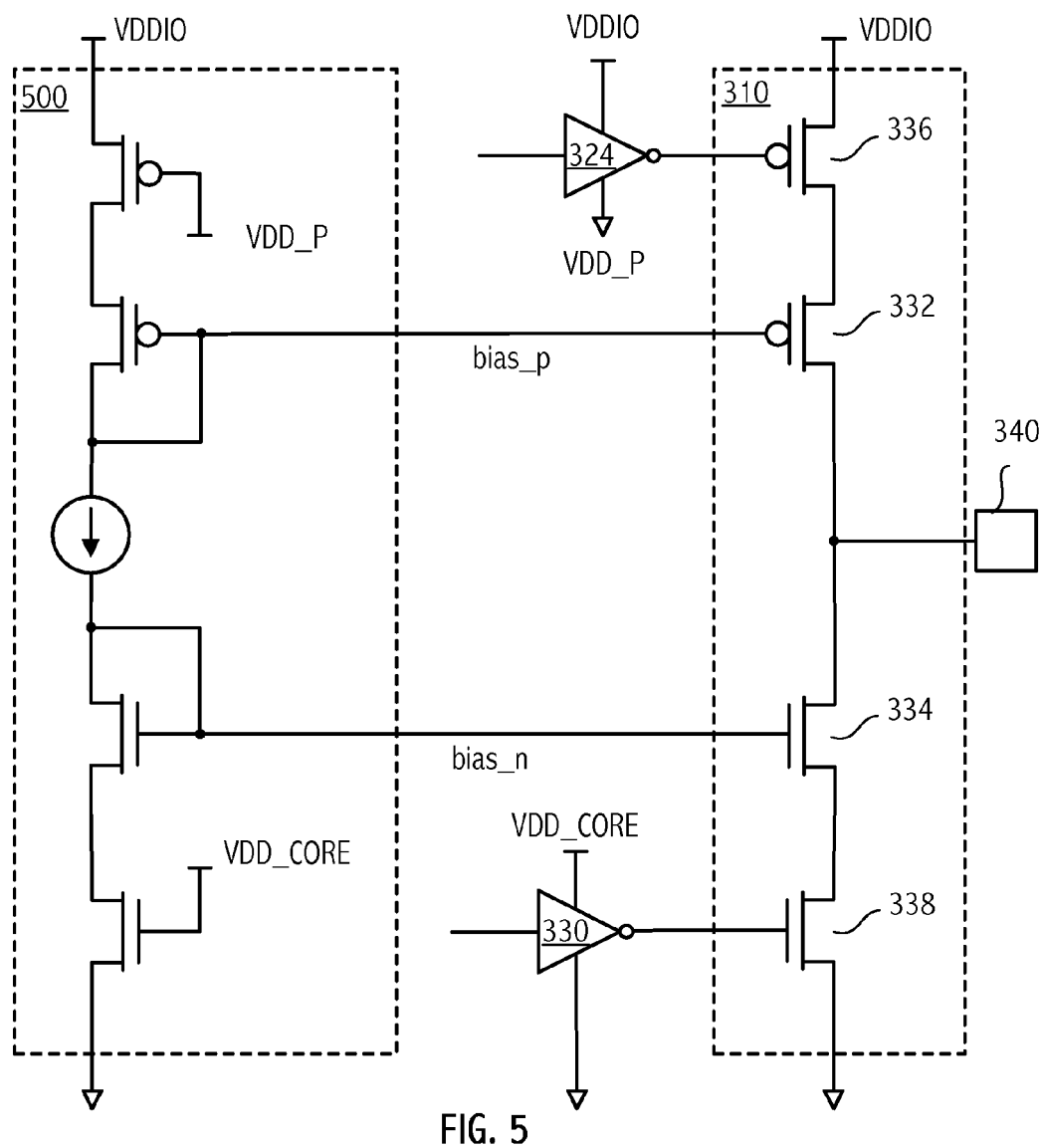
FIG. 5 illustrates an exemplary output driver circuit portion consistent with at least one embodiment of the invention.

Bias devices 332 and 334 are responsive to DC bias voltages (e.g., bias_p and bias_n, respectively). In at least one embodiment of output stage 310, bias_p is a DC bias voltage coupled to a first node of the external power supply (e.g., VDDIO) through an ideal voltage source, and bias_n is a DC bias voltage coupled to a second node of the external power supply (e.g., ground) through an ideal voltage source. For example, referring to FIG. 5, in at least one embodiment of bias voltage generation circuit 500, replica biasing techniques are used to generate bias_p and bias_n. However, other suitable techniques for generating bias voltages may be used (e.g., techniques using operational amplifiers, control loops, and/or bypass capacitors). Although only one bias device (e.g., bias devices 332 and 334) is illustrated corresponding to each input device (e.g., input devices 336 and 338, respectively) of output stage 310, one or more additional bias devices may be included in other embodiments of output stage 310.

Referring back to FIG. 3B, bias devices 332 and 334 suppress gate-to-source modulation that may exist on output devices 336 and 338 of output stage 310, thereby reducing the sensitivity to noise on the external power supply of the signal delivered to terminal 340 by output stage 310, as compared to the noise sensitivity of the signal delivered by output stage 309 of FIG. 3A. Referring back to FIG. 3B, in at least one embodiment of output stage 310, bias devices 332 and 334 are high-voltage devices and other devices in the signal path, including output devices 336 and 338, are lower-voltage or low-voltage devices. Accordingly, the signal path of FIG. 3B may operate at higher speeds than the signal path of FIG. 1A, which typically includes only high-voltage devices in predriver 108 and output stage 110. Note that electrostatic discharge protection circuitry (not shown) and/or other suitable circuitry may be coupled to terminal 340.

In general, embodiments of the output driver described herein achieve substantial power supply noise rejection and therefore improved integrated circuit performance over embodiments of the output driver circuit of FIG. 1. For example, noise on a signal provided by an external power supply of FIG. 1 can influence the delay through the output signal path, thereby increasing jitter of the output signal and degrading system performance. The increased power supply noise rejection of the output driver circuits of FIGS. 2A-5 reduce jitter on the output signal path resulting from noise on a signal provided by the external power supply. This improvement may be particularly noticeable in systems including multiple drivers where crosstalk between drivers can dominate the overall jitter budget. For example, in at least one embodiment of an output driver consistent with techniques described herein, crosstalk noise is reduced by a factor of approximately 10 as compared to an embodiment of output driver 100 (e.g., from approximately 50 ps with approximately 100 mV of external power supply noise to approximately 5 ps with approximately 100 mV of external power supply noise).

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, note that output stage 309 of FIG. 3A and output stage 310 of FIG. 3B are exemplary only and other output stages that are compliant with other signaling standards (e.g., SSTL (stub series terminated logic), CML (current-mode logic), LVDS (low-voltage differential signaling), LVPECL (low-voltage positive emitter-coupled logic), full-swing CMOS, HCSL (high-speed current steering logic), HSTL (high-speed transceiver logic) and LVTTL (low voltage transistor-transistor logic) or other suitable signaling standard) and/or include one or more ground referenced inputs and one or more external supply referenced inputs may be used. Variations and modifications of the embodiments disclosed herein may be made based on the description set forth herein, without departing from the scope and spirit of the invention as set forth in the following claims.

What is claimed is:

1. An integrated circuit comprising:
a first regulator circuit configured to receive power from an external power supply and configured to provide a first regulated voltage;
a second regulator circuit configured to receive power from the external power supply and configured to provide a second regulated voltage;
a first circuit configured to provide a first version of a signal, the first version of the signal being referenced between the first regulated voltage and a first power supply voltage, wherein the first power supply voltage is on a first power supply node coupled to the external power supply;
a second circuit configured to provide a second version of the signal, the second version of the signal being referenced between the second regulated voltage and a second power supply voltage, wherein the second power supply voltage is on a second power supply node coupled to the external power supply; and
a third circuit configured to provide to an output node, a third version of the signal, the third version of the signal being at least partially based on the first and second versions of the signal and the third version of the signal being further based on power received from the external power supply, the third version of the signal being referenced between the first power supply voltage and the second power supply voltage,
wherein the first version of the signal is a low voltage, low voltage swing signal and the second version of the signal is a high-voltage, low voltage swing signal, and the third version of the signal is a high voltage, high-voltage swing signal.

2. The integrated circuit, as recited in claim 1, further comprising:
a level-shifting circuit configured to introduce a DC offset into a ourth version of the signal, the fourth version of the signal being referenced between the first regulated voltage and the first power supply voltage to thereby provide to the second circuit a fifth version of the signal, the fifth version of the signal being referenced between the second regulated voltage and the second power supply voltage.

3. The integrated circuit, as recited in claim 1, wherein the second circuit comprises:
at least one capacitor configured to inject current to a node at least partially based on a transition of a fourth version of the signal; and
at least one feedback circuit configured to restore to the node a DC component of the fourth version of the signal that was substantially attenuated by the at least one capacitor.

4. The integrated circuit, as recited in claim 3,
wherein the fourth version of the signal is a first differential version of the signal,
wherein the at least one capacitor includes a differential capacitor circuit responsive to the first differential version of the signal, the first differential version of the signal being referenced between the first regulated voltage and the first power supply voltage,
wherein the at least one feedback circuit comprises a differential DC restoration circuit coupled to the at least one capacitor, and
wherein the second circuit further comprises a node configured to average a second differential version of the signal, the second differential version of the signal being referenced between the second regulated voltage and the second power supply voltage, the average being at least partially based on a third differential version of the signal, the third differential version of the signal being referenced between the second regulated voltage and the second power supply voltage and being provided by the differential DC restoration circuit.

5. The integrated circuit, as recited in claim 1, wherein the third circuit comprises:
a first multi-stage amplifier circuit of a first conductivity type coupled to the output node and the first power supply node, the first multi-stage amplifier circuit being responsive to a first bias voltage and the first version of the signal; and
a second multi-stage amplifier circuit of a second conductivity type coupled to the output node and the second power supply node, the second multi-stage amplifier circuit being responsive to a second bias voltage and the second version of the signal.

6. The integrated circuit, as recited in claim 5,
wherein the first multi-stage amplifier circuit comprises:
a first device of the first conductivity type coupled to the first power supply node and the first circuit; and
a second device of the first conductivity type coupled to the first device of the first conductivity type, the output node, and a first bias voltage generation circuit, and
wherein the second multi-stage amplifier circuit comprises:
a first device of the second conductivity type coupled to the second power supply node and the second circuit; and
a second device of the second conductivity type coupled to the first device of the second conductivity type, the output node, and a second bias voltage generation circuit.

7. The integrated circuit, as recited in claim 6,
wherein the first device of the first conductivity type is a low-voltage device and the second device of the first conductivity type is a high-voltage device; and
wherein the first device of the second conductivity type is a low-voltage device and the second device of the second conductivity type is a high-voltage device.

8. The integrated circuit, as recited in claim 1,
wherein the first regulator circuit is configured to generate the first regulated voltage to maintain a substantially constant voltage difference between the first regulated voltage and the first power supply voltage, and
wherein the second regulator circuit is configured to generate the second regulated voltage to maintain a substantially constant voltage difference between the second power supply voltage and the second regulated voltage.

9. A method comprising:
generating a first regulated voltage at least partially based on power received from an external power supply;
generating a second regulated voltage at least partially based on power received from the external power supply;
generating a first version of a signal, the first version of the signal being referenced between the first regulated voltage and a first power supply voltage, wherein the first power supply voltage is on a first power supply node coupled to the external power supply;
generating a second version of the signal, the second version of the signal being referenced between the second regulated voltage and a second power supply voltage, wherein the second power supply voltage is on a second power supply node coupled to the external power supply; and providing to an output node, a third version of the signal, the third version of the signal being at least partially based on the first and second versions of the signal and the third version of the signal being further based on power received from the external power supply, the third version of the signal being referenced between the first power supply voltage and the second power supply voltage, wherein a voltage level of the first regulated voltage and a voltage level of the second regulated voltage are greater than a voltage level of the first power supply voltage and the voltage level of the first regulated voltage and the voltage level of the second regulated voltage are less than a voltage level of the second power supply voltage.

10. The method, as recited in claim 9, wherein generating the second version of the signal further comprises:

level shifting a fourth version of the signal referenced between the first regulated voltage and the first power supply voltage, thereby generating a fifth version of the signal referenced between the second regulated voltage and the second power supply voltage.

11. The method, as recited in claim 10, wherein the level shifting comprises:

injecting current to a node at least partially based on a transition of the fourth version of the signal;

restoring to the node a DC component of the fourth version of the signal; and generating the second version of the signal at least partially based on a signal received from the node.

12. The method, as recited in claim 10, further comprising:

in response to a first condition, initializing a state of a circuit configured to perform the level shifting.

13. The method, as recited in claim 11, wherein the node is a differential node and generating the second version of the signal comprises:

averaging inverted and non-inverted signal components of a differential version of the signal received from the differential node, thereby reducing supply noise in the second version of the signal.

14. The method, as recited in claim 9, wherein generating the third version of the signal comprises:

reducing a first effect on the output node of variations in a gate-to-source voltage of a first device having a first type and being coupled to the first power supply node and responsive to the first version of the signal; and reducing a second effect on the output node of variations in a gate-to-source voltage of a second device having a second type and being coupled to the second power supply node and responsive to the second version of the signal.

15. The method, as recited in claim 14, wherein reducing the first effect comprises generating a first bias voltage at least partially based on the first power supply voltage and the first regulated voltage, and wherein reducing the second effect comprises generating a second bias voltage at least partially based on the second power supply voltage and the second regulated voltage.

16. The method, as recited in claim 9, wherein a voltage difference between the first regulated voltage and the first power supply voltage is substantially constant, and wherein a voltage difference between the second power supply voltage and the second regulated voltage is substantially constant.

17. An apparatus comprising:

means for generating a first version of a signal, the first version of the signal being referenced between a first regulated voltage and a first power supply voltage, wherein the first power supply voltage is on a first power supply node coupled to an external power supply;

means for generating a second version of the signal, the second version of the signal being referenced between a second regulated voltage and a second power supply voltage, wherein the second power supply voltage is on a second power supply node coupled to the external power supply; and means for providing to an output node, a third version of the signal, the third version of the signal being at least partially based on the first and second versions of the signal and the third version of the signal being further based on power received from the external power supply, the third version of the signal being referenced between the first power supply voltage and the second power supply voltage;

wherein a voltage level of the first regulated voltage and a voltage level of the second regulated voltage are greater than a voltage level of the first power supply voltage and the voltage level of the first regulated voltage and the voltage level of the second regulated voltage are less than a voltage level of the second power supply voltage.

18. The apparatus, as recited in claim 14, wherein the means for generating the second version of the signal comprises:

means for level shifting a fourth version of the signal referenced between the first regulated voltage and the first power supply voltage, thereby generating a fifth version of the signal referenced between the second regulated voltage and the second power supply voltage.

19. The apparatus, as recited in claim 14, wherein a voltage difference between the first regulated voltage and the first power supply voltage is substantially constant, and wherein a voltage difference between the second power supply voltage and the second regulated voltage is substantially constant.

20. An integrated circuit comprising:

a first regulator circuit configured to receive power from an external power supply and configured to provide a first regulated voltage;

a second regulator circuit configured to receive power from the external power supply and configured to provide a second regulated voltage;

a first circuit configured to provide a first version of a signal, the first version of the signal being referenced between the first regulated voltage and a first power supply voltage, wherein the first power supply voltage is on a first power supply node coupled to the external power supply;

a second circuit configured to provide a second version of the signal, the second version of the signal being referenced between the second regulated voltage and a second power supply voltage, wherein the second power supply voltage is on a second power supply node coupled power supply; and a third circuit configured to provide to an output node, a third version of the signal, the third version of the signal being at least partially based on the first and second versions of the signal and the third version of the signal being further based on power received from the external power supply the third version of the signal being referenced between the first power supply voltage and the second power supply voltage,
wherein a voltage level of the first regulated voltage and a voltage level of the second regulated voltage are greater than a voltage level of the first power supply voltage and the voltage level of the first regulated voltage and the voltage level of the second regulated voltage are less than a voltage level of the second power supply voltage.

21. The integrated circuit, as recited in claim 20, wherein the first signal is a low voltage, low voltage swing signal and the second signal is a high-voltage, low voltage swing signal, and the third signal is a high voltage, high-voltage swing signal.

22. The method, as recited in claim 1, wherein a voltage level of the first regulated voltage and a voltage level of the second regulated voltage are greater than a voltage level of the first power supply voltage and the voltage level of the first regulated voltage and the voltage level of the second regulated voltage are less than a voltage level of the second power supply voltage.

23. An integrated circuit comprising:
   a first regulator circuit configured to receive power from an external power supply and configured to provide a first regulated voltage;
   a second regulator circuit configured to receive power from the external power supply and configured to provide a second regulated voltage;
   a first circuit configured to provide a first version of a signal, the first version of the signal being referenced between the first regulated voltage and a first power supply voltage, wherein the first power supply voltage is on a first power supply node coupled to the external power supply;
   a second circuit configured to provide a second version of the signal, the second version of the signal being referenced between the second regulated voltage and a second power supply voltage, wherein the second power supply voltage is on a second power supply node coupled to the external power supply; and
   a third circuit configured to provide to an output node, a third version of the signal, the third version of the signal being at least partially based on the first and second versions of the signal and the third version of the signal being further based on power received from the external power supply, the third version of the signal being referenced between the first power supply voltage and the second power supply voltage.

* * * * *

UNITED STATES PATENT AND TRADEMARK OFFICE
CERTIFICATE OF CORRECTION

| | | |
|---|---|---|
| PATENT NO. | : 7,999,523 B1 | Page 1 of 1 |
| APPLICATION NO. | : 12/201070 | |
| DATED | : August 16, 2011 | |
| INVENTOR(S) | : Aaron J. Caffee et al. | |

It is certified that error appears in the above-identified patent and that said Letters Patent is hereby corrected as shown below:

In column 7, line 37, please replace "ourth" with --fourth--;
In column 10, line 20, please replace ";" with --,--;
In column 10, line 60, please insert --to the external-- after "coupled";
In column 10, line 66, please insert --,-- after "supply".

Signed and Sealed this
Fourth Day of October, 2011

David J. Kappos
*Director of the United States Patent and Trademark Office*